(12) United States Patent
Rotchford et al.

(10) Patent No.: US 7,190,213 B2
(45) Date of Patent: Mar. 13, 2007

(54) DIGITAL TIME CONSTANT TRACKING TECHNIQUE AND APPARATUS

(75) Inventors: Chris J. Rotchford, Phoenix, AZ (US); Clement R. Copolillo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 25 days.

(21) Appl. No.: 11/089,963

(22) Filed: Mar. 25, 2005

(65) Prior Publication Data

US 2006/0214725 A1 Sep. 28, 2006

(51) Int. Cl.
*H03K 17/90* (2006.01)

(52) U.S. Cl. ..................... 327/551; 327/553

(58) Field of Classification Search ................ None
See application file for complete search history.

(56) References Cited

U.S. PATENT DOCUMENTS

| | | | |
|---|---|---|---|
| 5,416,438 A | 5/1995 | Shibata | |
| 5,663,675 A | 9/1997 | O'Shaughnessy | |
| 5,914,633 A | 6/1999 | Comino et al. | |
| 6,169,446 B1 * | 1/2001 | Ramet et al. | 327/554 |
| 6,259,311 B1 | 7/2001 | Azimi et al. | |
| 6,417,727 B1 | 7/2002 | Davis | |
| 6,628,163 B2 | 9/2003 | Dathe | |
| 6,677,814 B2 | 1/2004 | Low et al. | |
| 6,686,809 B2 * | 2/2004 | Nystrom et al. | 333/17.1 |
| 6,798,218 B2 * | 9/2004 | Kasperkovitz | 324/658 |
| 6,803,813 B1 * | 10/2004 | Pham | 327/553 |

* cited by examiner

*Primary Examiner*—Timothy P. Callahan
*Assistant Examiner*—An T. Luu
(74) *Attorney, Agent, or Firm*—Ingrassia Fisher & Lorenz

(57) ABSTRACT

Methods and apparatus are provided for tuning out time constant deviations of a network (414) due to process, voltage, and temperature variations. The apparatus (400) comprises a clock reference (404) from which a digital time constant is correlated to the nominal time constant of the network (414). The correlated digital time constant is applied to the network (414), and the output charge/discharge waveform swing is compared to a predetermined reference voltage. If the charge/discharge waveform swing does not match the reference voltage, an offset signal is generated. The offset signal is applied to a control circuit (402) that generates a corresponding tuning signal. The tuning signal is applied to the network (414) to adjust the internal components incrementally until a match is achieved. The apparatus (400) can be configured as a built-in self-test digital time constant tracking circuit, and can be integrated with the network (414) on an IC chip.

20 Claims, 5 Drawing Sheets

US 7,190,213 B2

DIGITAL TIME CONSTANT TRACKING TECHNIQUE AND APPARATUS

TECHNICAL FIELD

The present invention generally relates to tuning networks, and more particularly relates to tuning out time constant variations of high precision networks.

BACKGROUND

Networks incorporating resistor-capacitor (RC) configurations are widely used in integrated circuit (IC) applications such as filters, phase-locked loops, frequency-based current references, and others. In general, the time constant of an RC-configured network is a determining factor in the performance of the network and its related circuitry. For example, the time delay and bandwidth of an RC-configured network are directly affected by its time constant. Therefore, any deviations in the specified time constant of such a network may adversely affect its functional parameters as well as those of its associated circuitry. The stability of a network time constant can be of particular importance when a relatively high level of precision performance is desired. However, time constant deviations in the approximate range of 20% to 25% can occur for a number of reasons, such as inconsistencies in IC manufacturing processes, IC supply voltage variations, environmental temperature changes, and the like.

Various tuning schemes have been employed to compensate for typical time constant deviations in IC applications. These tuning schemes have included the use of active elements and/or circuits within the network configuration that can be adjusted (tuned) to correct for detected variations in time constant values. Other types of tuning schemes have been based on the use of external networks that mimic the time constant of the actual network and provide a corrective reference for variations in the actual network. However, tuning schemes such as these typically require the use of external analog voltages, and also generally involve a relatively high part count in the external tuning and calibration circuitry. As such, the attainable tuning accuracy of a network is generally limited by the complexity of the external tuning and calibration circuitry.

Accordingly, it is desirable to provide a built-in (on-chip) self-test capability for automatically compensating RC time constant deviations that may be caused by factors such as fabrication processes, supply voltage variations, temperature changes, and the like. In addition, it is desirable to provide a built-in automatic tuning capability with relatively high precision that does not require external circuitry. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and FIG. 1 includes a schematic (1a) of a simplified RC filter network, a diagram (1b) of a typical RC charge/discharge waveform, and a graph (1c) of a typical RC filter bandwidth.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention pertain to the area of tuning out deviations in the time constant of RC-configured networks such as filters. A digital time constant is derived from a clock reference standard and is correlated with the desired (nominal) time constant of the network. The digital time constant is applied to the network and the resulting output voltage waveform swing is compared to a reference voltage representing the appropriate value for the nominal time constant. If the output voltage waveform swing does not match the reference voltage, components within the network are adjusted to compensate for the discrepancy. The above described test and calibration elements can be configured as a built-in self-test circuit that can be integrated directly (e.g., on a chip) with the network.

Figure 1A:
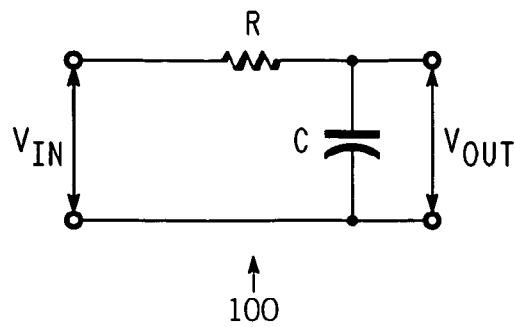
Figure 1B:
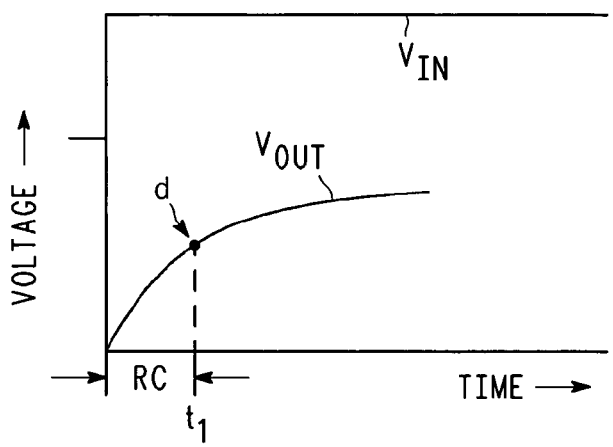
Figure 1C:
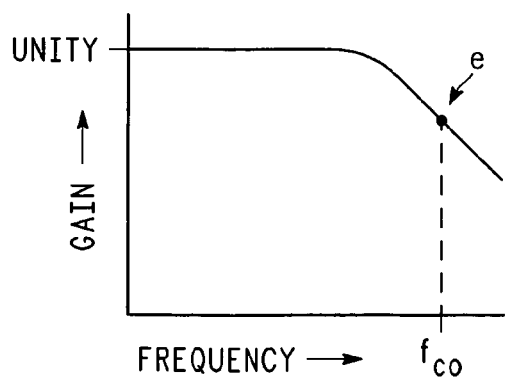

A basic RC filter network 100 is shown in FIG. 1(a). In this configuration, network 100 could typically function as a low-pass filter or as an integrator circuit. FIG. 1(b) illustrates typical waveforms for an input voltage $V_{in}$ and a resulting output waveform $V_{out}$. Point d on the output waveform $V_{out}$ represents a value of approximately 63% of the maximum level of $V_{in}$ for an initially discharged network. The time elapsed ($t_1$) for output waveform $V_{out}$ to reach point d is generally designated as the RC time constant of network 100, and is equal to the product of R and C. In FIG. 1(c), point e typically represents the 3 db frequency response of network 100. That is, the gain at point e is approximately 70% of unity, and the corresponding power output is approximately 50% of unity. The 3 db frequency ($f_{co}$) corresponding to point e is typically designated as the upper cut-off frequency for a low-pass filter application, and is equal to the reciprocal of $2\pi RC$.

As indicated in the FIG. 1 examples, the RC time constant directly affects certain characteristics of a network, such as the voltage vs. time relationship and the frequency response. Therefore, the proper functioning of an RC network is largely dependent on the stability of the values of its R and C components. In the case of a high precision RC network application, the stability of the R and C components is especially important. As previously noted, IC manufacturing processes can produce deviations in the specified values of R and C components, and variations in supply voltages and environmental temperature can also adversely affect R and C stability. To compensate for RC deviations such as these, corrective action can be taken to adjust the RC time constant of a network to maintain its specified (nominal) value.

According to an exemplary embodiment of a method and apparatus for stabilizing the RC value of a network, a digital time constant is derived from a precision frequency standard such as a crystal oscillator. The digital time constant is correlated with the time constant of the network to be stabilized, and the network response to the digital time constant is compared to a predetermined reference. Deviations from the reference cause changes to be made in the network components such that the nominal RC time constant is maintained.

To derive the digital time constant in this exemplary embodiment, a frequency standard clock is divided by a factor n to achieve a pulse width that is correlated to the charge time of the network. For example, the pulse duration $t_p$ of a 50% duty cycle clock signal $f_{clk}$ divided by n can be described as:

$$t_p = (\tfrac{1}{2})\, n/f_{clk} \qquad \text{Equation (1)}$$

For an exemplary RC network that has been initially charged, the charge time $t_{ch}$ can be expressed as:

$$t_{ch} = RC \ln\,(V_{dd}-V_1)/(V_{dd}-V_2) \qquad \text{Equation (2)}$$

where $V_{dd}$ is the supply voltage; $V_1$ is the low value of the charging waveform; and $V_2$ is the high value of the charging waveform.

To correlate the digital time constant with the charge time of the network, the digital time constant $t_p$ of Equation (1) can be set equal to the charge time $t_{ch}$ of Equation (2) as follows:

$$(\tfrac{1}{2})\, n/f_{clk} = RC \ln\,\{(V_{dd}-V_1)/(V_{dd}-V_2)\} \qquad \text{Equation (3)}$$

For this exemplary embodiment, assume that $V_1 = \tfrac{1}{8} V_{dd}$ and that $V_2 = \tfrac{7}{8} V_{dd}$ Equation (3) can then be rewritten as:

$$n/2\, f_{clk} = RC \ln(7 V_{dd}/1 V_{dd}) \qquad \text{Equation (4)}$$

or as:

$$\tfrac{1}{2} RC = \{f_{clk} \ln(7)\}/n \qquad \text{Equation (5)}$$

To solve for the frequency divider n in terms of the network output voltage frequency $f_{ovs}$, the two sides of Equation (5) can be divided by pi ($\pi$), as follows:

$$f_{ovs} = \tfrac{1}{2} RC = \{f_{clk} \ln(7)\}/n\pi \qquad \text{Equation (6)}$$

and Equation (6) can be rewritten to solve for n in terms of $f_{ovs}$:

$$n = \{f_{clk} \ln(7)\}/f_{ovs}\pi \qquad \text{Equation (7)}$$

Figure 2:
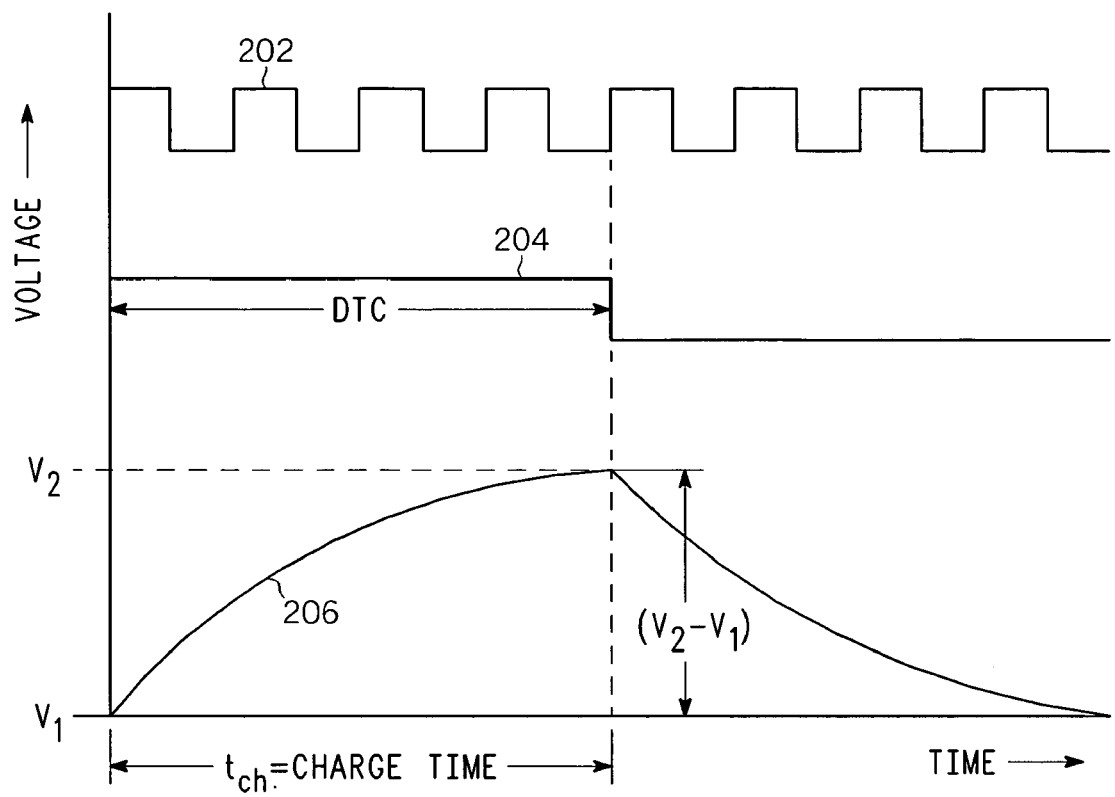
FIG. 2 is a timing diagram of an exemplary embodiment of a digital time constant.

The relationships derived above for clock frequency $f_{clk}$, digital time constant (DTC) $t_p$, and charge time $t_{ch}$ are illustrated in the timing diagram of FIG. 2. A clock signal 202 ($f_{clk}$) is shown in this example to be divided by an n factor of 4 in order to generate a DTC pulse 204. With clock signal 202 applied to an exemplary network (not shown), the resultant waveform, as represented by curve 206, reaches a peak value at a charge time $t_{ch}$ that is essentially equal to the width of DTC pulse 204, and the network output voltage swing is indicated as $(V_2-V_1)$. Therefore, for a given network configuration, the desired nominal component values determining the network time constant (e.g., R and C) will typically provide the "ideal" response relationships as depicted in FIG. 2. If there are deviations in the network components, however, the resulting changes in time constant will generally alter the desired relationships of FIG. 2.

Figure 3:
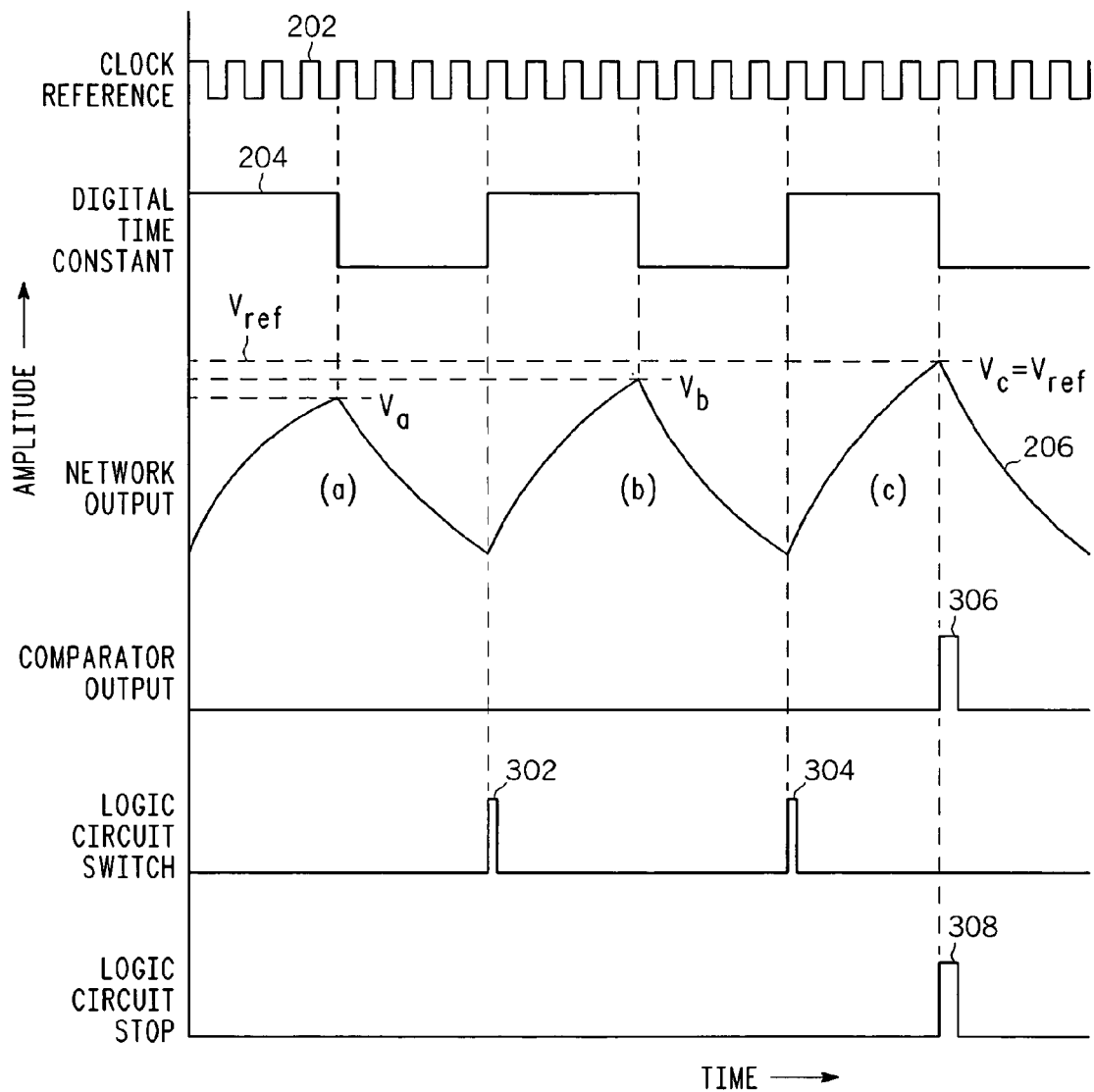
FIG. 3 is a timing diagram of an exemplary embodiment of a digital time constant tracking process.

In order to compensate for network time constant variations, an exemplary embodiment of a "tuning" arrangement measures the output voltage swing of an adjustable network and compares it to a predetermined reference voltage. If there is a mismatch, a logic command is generated that changes the network time constant until a match is achieved. This exemplary process is illustrated in the timing diagram of FIG. 3, which carries over the clock reference 202 and digital time constant 204 from FIG. 2. In FIG. 3, however, it is assumed that a network component (e.g., a capacitor array) has increased from its nominal value, and is causing the network to charge at a slower rate than desired (curve 206 (a)). As such, output voltage swing $V_a$ does not match reference voltage $V_{ref}$, and no match signal is generated. For clarity, $V_{ref}$ in this example represents output voltage swing $(V_2-V_1)$ in FIG. 2.

In the absence of a match signal, a logic command 302 is generated that switches out (decreases) a predetermined amount of the capacitor array in the network. The resulting faster charge rate (curve 206 (b)) achieves an increased output voltage swing $V_b$, but, in this example, the increased voltage swing $V_b$ still does not match reference voltage $V_{ref}$. Therefore, another logic command 304 is generated to decrease the capacitor array by another predetermined step. In this example, the resulting charge curve 206 (c) does achieve an output voltage swing $V_c$ that matches reference voltage $V_{ref}$, thereby generating an output 306 that enables a logic command 308 to stop the tuning process.

Figure 4:
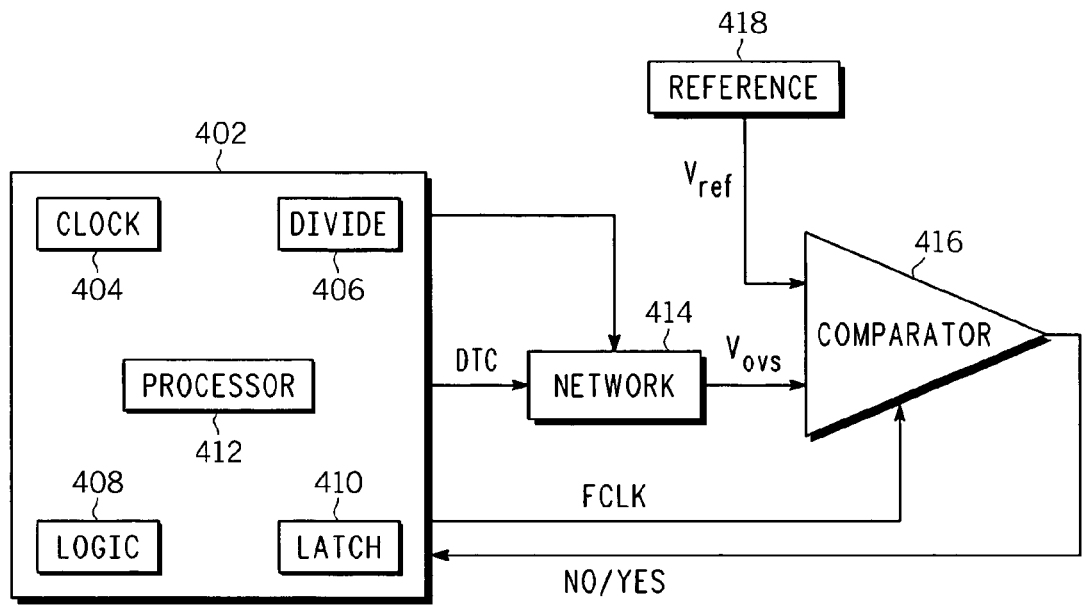
FIG. 4 is a block diagram of an exemplary embodiment of a digital time constant tracking circuit.

An exemplary embodiment of a digital time constant (DTC) tracking system 400 that is configured to implement the tuning process depicted in FIG. 3 is shown in block diagram form in FIG. 4. In this embodiment, a control circuit 402 includes a clock reference module 404, a clock divider module 406, a logic command module 408, a latch module 410, and a processor 412. The algorithms that enable the proper functioning of control circuit 402 are typically implemented by processor 412, which may be any type of microprocessor, micro-controller, or other computing device capable of executing instructions in any computing language. An adjustable (tunable) network 414 is connected between control circuit 402 and a comparator 416. Network 414 is typically configured with a capacitor array and/or a resistor array that can be "tuned" by switching array elements in or out. Comparator 416 is typically configured with a reference voltage input ($V_{ref}$) and a clock reference input ($f_{clk}$), in addition to receiving an output voltage swing signal ($V_{ovs}$) from network 414. Reference voltage input $V_{ref}$ is typically derived from a precision resistance ladder 418 connected across a supply voltage (not shown). Clock reference input $f_{clk}$ is typically supplied by clock reference module 404.

Clock reference module 404 can be implemented by any suitable frequency standard such as a crystal oscillator clock circuit in order to maintain a relatively high level of accuracy in the derivation of the digital time constant. While the simplified diagrams of FIGS. 2 and 3 show a divider n equal to 4 for the purpose of illustrating the relationship between a clock signal $f_{clk}$ and a DTC, a more realistic value of n might be in the approximate range of 100 to 200, thus offering the combined benefits of high accuracy and high resolution. For example, a filter network operating at 250 kHz might be calibrated by a digital time constant derived from a 30 MHz clock reference with a divider n value of 120.

Figure 5:
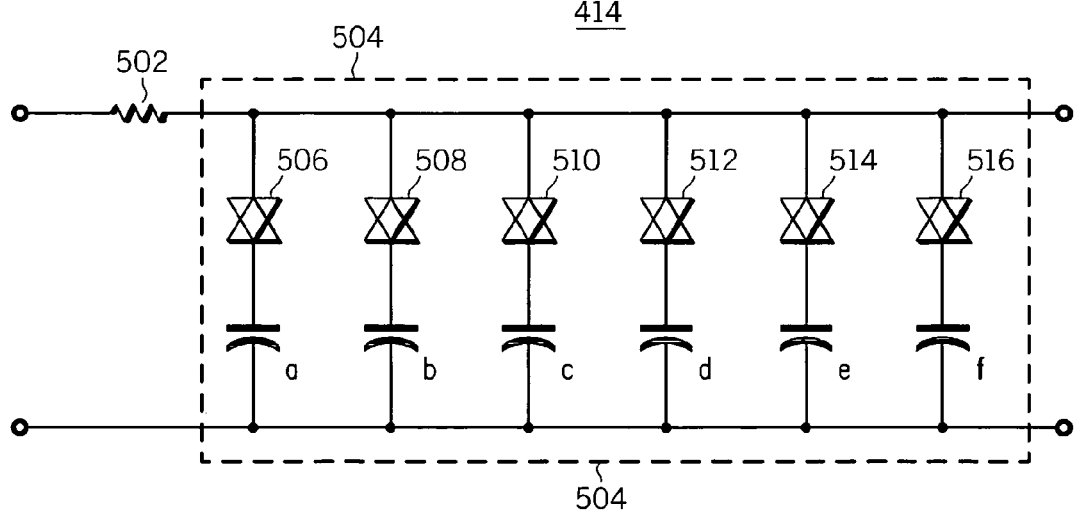
FIG. 5 is a schematic of an exemplary single-ended tunable RC network.

A typical configuration for adjustable network 414 includes a combination of resistor and capacitor elements such as those illustrated in FIG. 5. In this exemplary embodiment of an RC filter 414, a resistor 502 is shown as a simplified representation of any type of resistance configuration, such as a switched array or other resistor combination, in series with a capacitor array 504. For clarity in this example, only capacitor array 504 is shown in a tunable configuration, whereas tunable resistor arrays and/or tunable capacitor arrays may be used, depending on the dictates of the application.

In the exemplary embodiment of FIG. 5, capacitor array 504 is connected to resistor 502 in a typical low pass filter configuration. Capacitor array 504 may be configured in any suitable arrangement to enable the overall capacitance value to be adjusted incrementally. In this exemplary embodiment, array capacitors 504a, 504b, 504c, 504d, 504e, 504f are connected to the circuit through programmable switches 506, 508, 510, 512, 514, 516, respectively, so that they may be individually switched in or out. The values of programmable array capacitors 504a through 504f are generally selected to provide a relatively wide bandwidth excursion (e.g., in the approximate range of +/−30% or more), while maintaining relatively narrow incremental steps (e.g., in the approximate range of +/−3% to +/−6%). As noted above, this exemplary arrangement is merely one of many possible configurations that may be used for tuning a capacitor array (or a similarly configured resistor array) in accordance with the disclosed digital time constant tracking scheme.

Figure 6:
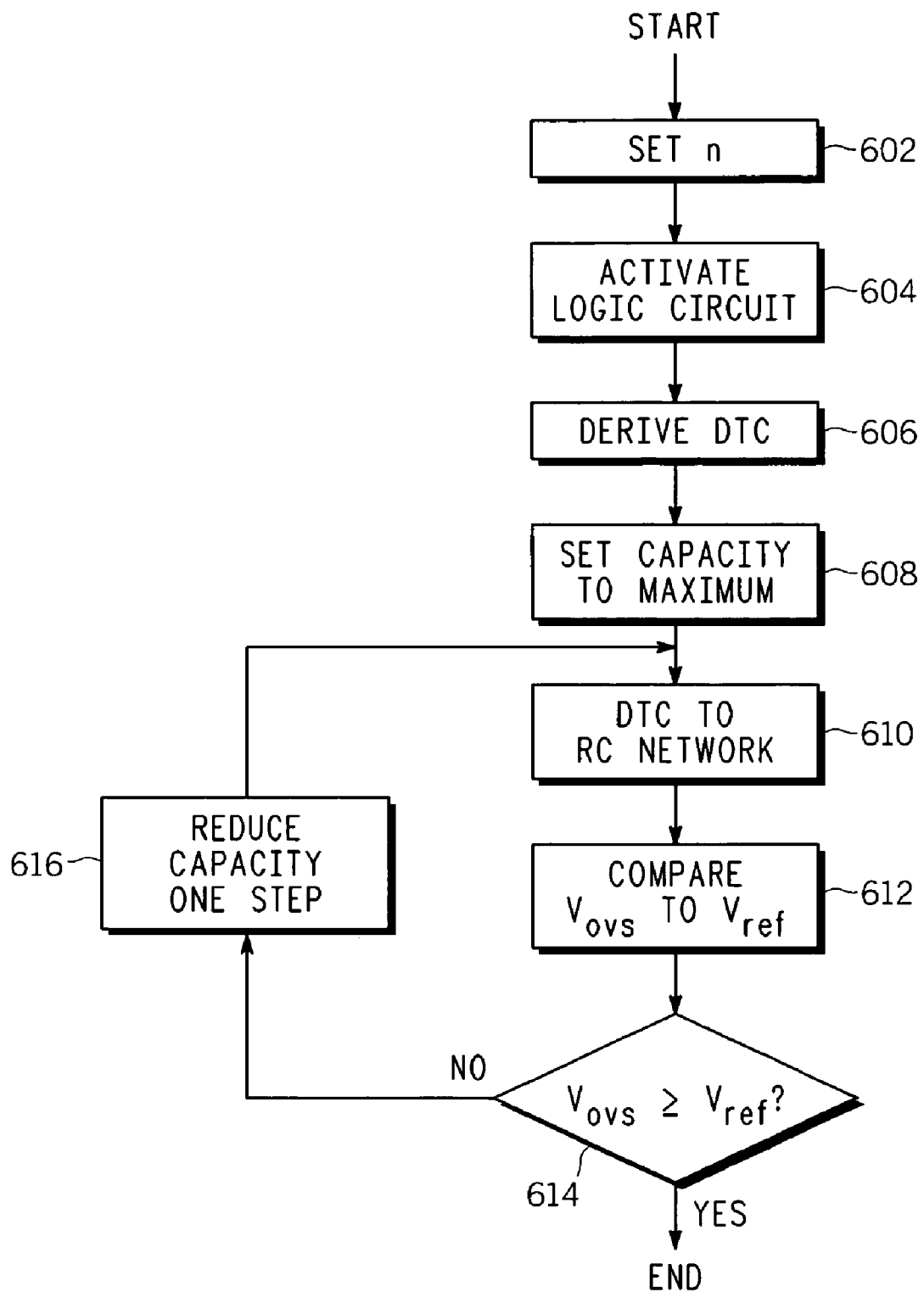
FIG. 6 is a flow diagram of an exemplary embodiment of a digital time constant tracking process.

A typical operational sequence of an exemplary digital time constant tracking process, as illustrated in FIGS. 3–5, can be more fully described in conjunction with the flow diagram 600 of FIG. 6. In step 602, a value for n is entered into clock divider module 406. In step 604, control circuit 402 is activated to initialize digital time constant tracking circuit 400 (FIG. 4) prior to calibrating RC network 414. In step 606, a digital time constant (DTC) is typically derived by dividing the clock reference $f_{clk}$ (module 404) by n, as illustrated by waveforms 202 and 204 in FIG. 3. In step 608, capacitor array 504 (FIG. 5) is set to maximum value by programming commands from processor 412 to switches 506, 508, 510, 512, 514, 516 to connect array capacitors 504a through 504f into the RC network. As such, the total array capacitance is configured to be greater than the desired nominal capacitance value, so that the tuning process can be unidirectional; that is, the reduction of capacitance incrementally by removing individual array capacitors until the desired value is reached.

In step 610, the DTC signal is applied to RC network 414, and the resulting output voltage swing ($V_{ovs}$) is applied to an input of comparator 416 (FIG. 4). In step 612, output voltage swing ($V_{ovs}$) is compared to reference voltage ($V_{ref}$) at the clock reference ($f_{clk}$) rate, to determine if a match has been achieved. Lath module 410 (FIG. 4) is generally configured to synchronize the timing of the DTC signal applied to RC network 414 with the discrete comparison measurements made by comparator 416. Latch module 410 is typically also configured to equalize the supply voltage for the DTC signal and the reference voltage ($V_{ref}$).

With the total value of capacitor array 504 (FIG. 5) connected to RC network 414, the output voltage swing ($V_{ovs}$) of RC network 414 is typically represented by charging waveform 206(a) in FIG. 3, which peaks at a level $V_a$ that is less than $V_{ref}$. In step 614, comparator 416 outputs a "no" signal to control circuit 402, indicating that a match has not been achieved. In step 616, control circuit 402 enables logic command module 408 to output a switching signal (302 in FIG. 3) that, for example, opens switch 506 (FIG. 5) to incrementally reduce the total capacitance of capacitor array 504. In the next cycle, the subsequent output voltage swing ($V_{ovs}$) reaches a level $V_b$, as represented by charging waveform 206b in FIG. 3. Since $V_b$ is still less than $V_{ref}$, comparator 416 again outputs a "no" signal (step 614), and logic command module 408 outputs a second switching signal (304) in step 616. Switching signal 304, for example, causes switch 508 (FIG. 5) to open, further reducing the capacitance of array 504 by the value of capacitor 504b. As a result, the next output voltage swing ($V_{ovs}$) reaches a level $V_c$, as indicated by charging waveform 206(c) in FIG. 3. Since $V_C$ is essentially equal to (or slightly greater than) $V_{ref}$, comparator 416 outputs a "yes" signal (306 in FIG. 3) in step 614, and the calibration process ends via a control circuit 402 stop signal 308, as indicated in FIG. 3.

It will be appreciated that the exemplary digital time constant tracking process described herein can apply to a differential network as well as to a single-ended network such as RC network 414. In the case of a network receiving a differential DTC input, for example, the associated comparator would typically be configured with corresponding differential reference voltages. Referring back to the diagrams in FIG. 2, the curve 206 can be considered as the output voltage swing of a differentially configured network, while voltage levels $V_2$ and $V_1$ can represent the corresponding differential reference voltages. It will also be appreciated that the exemplary digital time constant tracking process described herein can apply to any type of time constant-dependent circuit, such as a network having any combination of R, L and/or C components.

An exemplary digital time constant tracking circuit as described herein can be configured as a self-contained built-in test and calibration system on an IC chip, for example. As such, the DTC tracking circuit can be used not only to tune/retune networks at any time, but can also be configured to compute corresponding variations in environmental factors such as temperature and supply voltage. Moreover, the DTC tracking circuit can be configured to monitor trends in resistor, capacitor, etc. behavior that could signal approaching end-of-life characteristics.

Accordingly, the shortcomings of the prior art have been overcome by providing an improved time constant tuning process that does not require the use of external voltages or references. A built-in self-test calibration system derives a precise digital time constant from a clock frequency standard. The digital time constant is correlated with the nominal/desired time constant of a tunable network to be calibrated. The correlated digital time constant is applied to the tunable network and the resulting output voltage swing is compared to a reference voltage representing the nominal time constant characteristic of the tunable network. If the output voltage swing does not match the reference voltage, the tunable network components are adjusted incrementally until a match is achieved.

The tunable network is typically configured with at least resistor and/or capacitor arrays that can be adjusted incrementally by logic command signals. The clock frequency standard is typically configured as a crystal oscillator, while the reference voltage is typically derived from a precision resistor ladder. The comparison of output voltage swing and reference voltage is typically implemented in a comparator that is synchronized to the clock frequency standard. The comparator is configured to output a tune signal in the absence of a match and to output a stop signal when a match is achieved. A control circuit is typically configured to receive the output signals from the comparator and to generate logic commands to implement or to stop the tuning adjustment of the network. The tunable network may be single-ended or differential, and may be comprised of resistive, capacitive, and/or inductive components. The tunable network may be configured as a filter or any other type of network whose function is generally related to the network time constant. The disclosed built-in self-test calibration system can be configured to tune/retune the tunable network at any time, to compute corresponding variations in environmental factors, and to monitor trends in component behavior for end-of-life indications.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of tuning out time constant variations in a network, comprising the steps of:
    deriving a digital time constant pulse having a width correlated to the nominal time constant of the network;
    processing the digital time constant pulse through the network and measuring the output voltage waveform of the network;
    comparing the voltage swing of the output voltage waveform to a predetermined reference voltage during each digital time constant pulse time period;
    generating a tune signal when the voltage swing of the output voltage waveform does not equal or exceed the level of the predetermined reference voltage, and generating a stop signal when the voltage swing of the output voltage waveform does equal or exceed the level of the predetermined reference voltage;
    converting the tune signal into a compensation signal for adjusting the time constant of the network; and
    adjusting the time constant of the network with the compensation signal so that the voltage swing of the output voltage waveform is substantially equal to the predetermined reference voltage.

2. The method of claim 1 wherein the network is single-ended or differential.

3. The method of claim 1 wherein the network comprises resistive, capacitive, and inductive components.

4. A digital time constant tracking circuit for tuning out time constant variations of a resistor-capacitor (RC) network, comprising:
    a clock reference standard configured to generate digital time constant pulses having a pulse width correlated to the nominal time constant of the RC network;
    a resistor array and a capacitor array within the RC network configured to receive the digital time constant pulses from the clock reference standard and to output a charge/discharge waveform in time synchronism with the received digital time constant pulses;
    a comparator configured to receive the charge/discharge waveform from the RC network at a first input, and to receive a predetermined reference voltage at a second input, and to generate a tune signal when the voltage swing of the charge/discharge waveform does not equal or exceed the level of the predetermined reference voltage, and to generate a stop signal when the voltage swing of the charge/discharge waveform does equal or exceed the level of the predetermined reference voltage; and
    a control circuit configured to receive the tune and stop signals from the comparator, and to generate an output tuning signal corresponding to a received tune signal, wherein the output tuning signal is applied to the resistor and capacitor arrays in the RC network to adjust the time constant of the RC network so that the voltage swing of the charge/discharge waveform is substantially equal to the predetermined reference voltage.

5. The digital time constant tracking circuit of claim 4 wherein the clock reference standard is a crystal oscillator.

6. The digital time constant tracking circuit of claim 4 wherein the predetermined reference voltage is derived from a precision resistor ladder.

7. The digital time constant tracking circuit of claim 4 wherein the digital time constant tracking circuit is configured as a built-in self test system.

8. The digital dine constant tracking circuit of claim 4 wherein the comparator is configured to receive the clock reference standard at a third input, and to generate a tune or a stop signal at a rate synchronized to the frequency of the clock reference standard.

9. The digital time constant tracking circuit of claim 4 wherein the RC network is single-ended or differential.

10. The digital time constant tracking circuit of claim 7 wherein the RC network is configurable to be tuned at any time.

11. The digital time constant tracking circuit of claim 10 wherein variations in environmental factors corresponding to the RC network timing changes are computed.

12. The digital time constant tracking circuit of claim 11 wherein trends in component behavior of the RC network are monitored.

13. A digital time constant tracking circuit for stabilizing the time constant and corresponding bandwidth of a filter network, comprising:
    a clock reference standard configured to generate digital time constant pulses having a pulse width correlated to the nominal time constant of the filter network;
    a component array within the filter network configured to receive the digital time constant pulses from the clock reference standard and to generate an output voltage waveform in time synchronism with the received digital time constant pulses;
    a comparator configured to receive the output voltage waveform from the filter network at a first input, and to receive a predetermined reference voltage at a second input, and to generate a tune signal when the voltage swing of the output voltage waveform does not equal or exceed the level of the predetermined reference voltage, and to generate a stop signal when the voltage swing of the output voltage waveform does equal or exceed the level of the predetermined reference voltage; and
    a control circuit configured to receive the tune and stop signals from the comparator, and to generate an output tuning signal corresponding to a received tune signal, wherein the output tuning signal is applied to the component array in the filter network to adjust the time constant of the filter network so that the voltage swing of the output voltage waveform is substantially equal to the predetermined reference voltage, thereby stabilizing the time constant and the corresponding bandwidth of the filter network.

14. The digital time constant tracking circuit of claim 13 wherein the clock reference standard is a crystal oscillator.

15. The digital time constant tracking circuit of claim 13 wherein the predetermined reference voltage is derived from a precision resistor ladder.

16. The digital time constant tracking circuit of claim 13 wherein the digital time constant tracking circuit is configured as a built-in self-test system.

17. The digital time constant tracking circuit of claim 13 wherein the comparator is configured to receive the clock reference standard at a third input and to generate a tune or a stop signal at a rate synchronized to the frequency of the clock reference standard.

18. The digital time constant tracking circuit of claim 13 wherein the filter network is single-ended or differential.

19. The digital time constant tracking circuit of claim 13 wherein the filter network comprises resistive, capacitive, and inductive components.

20. The digital time constant tracking circuit of claim 16 wherein variations in environmental factors corresponding to the filter network tuning changes are computed.

* * * * *